(12) United States Patent
Hollis

(10) Patent No.: US 8,792,247 B2
(45) Date of Patent: Jul. 29, 2014

(54) APPARATUS FOR BYPASSING FAULTY CONNECTIONS

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 13/588,728

(22) Filed: Aug. 17, 2012

(65) Prior Publication Data

US 2012/0306668 A1  Dec. 6, 2012

Related U.S. Application Data

(62) Division of application No. 12/323,241, filed on Nov. 25, 2008, now Pat. No. 8,259,461.

(51) Int. Cl.
*H05K 7/00* (2006.01)

(52) U.S. Cl.
USPC ........... 361/760; 257/685; 257/686; 257/690; 365/51

(58) Field of Classification Search
USPC .............. 361/760; 257/685, 686, 690; 365/51
See application file for complete search history.

(56) References Cited

U.S. PATENT DOCUMENTS

| | | | |
|---|---|---|---|
| 3,949,242 A | 4/1976 | Hirasawa et al. | |
| 4,038,564 A | 7/1977 | Hakata | |
| 4,205,203 A * | 5/1980 | Mehta et al. | 370/525 |
| 4,408,135 A | 10/1983 | Yuyama et al. | |
| 5,048,022 A | 9/1991 | Bissett et al. | |
| 5,056,015 A * | 10/1991 | Baldwin et al. | 703/27 |
| 5,266,833 A * | 11/1993 | Capps | 257/690 |
| 5,327,426 A * | 7/1994 | Dolin et al. | 370/235 |
| 5,382,847 A | 1/1995 | Yasuda | |
| 5,428,754 A * | 6/1995 | Baldwin | 712/220 |
| 5,502,333 A * | 3/1996 | Bertin et al. | 257/685 |
| 5,745,003 A | 4/1998 | Wakimoto et al. | |
| 6,097,519 A | 8/2000 | Ford et al. | |
| 6,133,626 A | 10/2000 | Hawke et al. | |
| 6,137,849 A | 10/2000 | Humphrey | |
| 6,140,841 A | 10/2000 | Suh | |
| 6,292,014 B1 | 9/2001 | Hedberg | |
| 6,339,622 B1 | 1/2002 | Kim | |
| 6,438,178 B1 | 8/2002 | Lysdal et al. | |
| 6,486,549 B1 | 11/2002 | Chiang | |
| 6,646,472 B1 | 11/2003 | Trivedi et al. | |
| 6,772,351 B1 | 8/2004 | Werner et al. | |

(Continued)

OTHER PUBLICATIONS

U.S. Appl. No. 12/053,265, filed Mar. 21, 2008.

(Continued)

*Primary Examiner* — Xiaoliang Chen
(74) *Attorney, Agent, or Firm* — Knobbe, Martens, Olson & Bear, LLP

(57) ABSTRACT

Apparatus are disclosed, such as those involving a 3-D integrated circuit. One such apparatus includes a first die including a plurality of vertical connectors formed therethrough. The apparatus also includes a first circuit configured to encode multiple data bits into a multi-bit symbol, and provide the multi-bit symbol to two or more of the vertical connectors. The apparatus further includes a second circuit configured to receive the multi-bit symbol from at least one of the two or more vertical connectors, and decode the multi-bit symbol into the multiple data bits. The apparatus provides enhanced repairability with no or less redundant vertical connectors, thus avoiding the need for "on the fly" or field repair of defective vertical connectors.

20 Claims, 10 Drawing Sheets

(56) References Cited

U.S. PATENT DOCUMENTS

| | | |
|---|---|---|
| 6,794,899 B2 | 9/2004 | Lee et al. |
| 6,861,737 B1 | 3/2005 | Jeong et al. |
| 7,053,655 B2 | 5/2006 | Brox |
| 7,072,415 B2 | 7/2006 | Zerbe et al. |
| 7,113,417 B2 | 9/2006 | Pochmuller |
| 7,206,876 B2 | 4/2007 | Jang |
| 7,729,151 B2 * | 6/2010 | Tsern et al. ............ 365/51 |
| 8,026,740 B2 | 9/2011 | Hollis |
| 2003/0047798 A1 | 3/2003 | Halahan |
| 2003/0095606 A1* | 5/2003 | Horowitz et al. ............ 375/286 |
| 2004/0114854 A1 | 6/2004 | Ouchi |
| 2005/0051903 A1 | 3/2005 | Ellsberry et al. |
| 2005/0088314 A1 | 4/2005 | O'Toole et al. |
| 2005/0098868 A1 | 5/2005 | Chang et al. |
| 2005/0108459 A1 | 5/2005 | Pochmuller |
| 2005/0170600 A1 | 8/2005 | Fukuzo |
| 2006/0019484 A1 | 1/2006 | Chen et al. |
| 2006/0071316 A1 | 4/2006 | Garth |
| 2007/0070669 A1* | 3/2007 | Tsern ............ 365/51 |
| 2007/0153618 A1 | 7/2007 | Fujito et al. |
| 2007/0194426 A1 | 8/2007 | Hsu |
| 2008/0029870 A1 | 2/2008 | Chen et al. |
| 2008/0036050 A1 | 2/2008 | Lin et al. |
| 2008/0036082 A1 | 2/2008 | Eun |
| 2008/0048832 A1 | 2/2008 | O'Toole et al. |
| 2008/0082878 A1* | 4/2008 | Check et al. ............ 714/724 |
| 2008/0143379 A1 | 6/2008 | Norman |
| 2008/0157318 A1 | 7/2008 | Chow et al. |
| 2009/0102037 A1* | 4/2009 | Kim ............ 257/686 |
| 2009/0161402 A1* | 6/2009 | Oh et al. ............ 365/51 |
| 2009/0168855 A1 | 7/2009 | Balamurugan et al. |

OTHER PUBLICATIONS

Farzan et al., "A CMOS 10-Gb/s power-efficient 4-PAM transmitter," *IEEE Journal of Solid-State Circuits*, vol. 39, No. 3, pp. 529-532 (Mar. 2004).

Farjad-Rad et al., "An equalization scheme for 10Gb/s 4-PAM signaling over long cables," Center for Integrated System, Stanford University, *Mixed Signal Conference*, Jul. 1997, Cancun, Mexico, 4 pages.

Farjad-Rad et al., "A 0.4 μm CMOS 10-Gb/s 4-PAM pre-emphasis serial link transmitter," *IEEE VLSI Symposium* 1998, 2 pages.

Zerbe et al., "1.6 Gb/s/pin 4-PAM signaling and circuits for a multi-drop bus," *Symposium on VLSI Circuits Digest of Technical Papers*, vol. 10, No. 2, pp. 128-131 (2000).

Zerbe et al., "Equalization and Clock Recovery for a 2.5-10Gb/s 2-PAM/4-PAM/ backplane transceiver cell," *IEEE International Solid-State Circuits Conference*, ISSCC 2003 / Session 4 / Clock Recovery and Backplane transceivers / Paper 4.6 (2003).

* cited by examiner

APPARATUS FOR BYPASSING FAULTY CONNECTIONS

CROSS-REFERENCE TO RELATED APPLICATION

This application is a divisional of U.S. patent application Ser. No. 12/323,241, filed Nov. 25, 2008, titled "APPARATUS FOR BYPASSING FAULTY CONNECTIONS," the disclosure of which is hereby incorporated by reference in its entirety herein.

BACKGROUND OF THE INVENTION

1. Field of the Invention

Embodiments of the invention relate to integrated circuits, and more particularly, in one or more embodiments, to 3-D integrated circuits.

2. Description of the Related Art

Integrated circuits (ICs) may include many devices and circuit members that are formed on a single semiconductor wafer or die. The current trends in IC technology are towards faster and more complicated circuits. However, as more complex ICs are manufactured, various speed-related problems become more challenging. This is especially true when ICs having different functions are used to create electronic systems, for example, computing systems including processor and memory ICs, where different ICs are electrically connected by a network of global interconnects. As global interconnects become longer and more numerous in electronic systems, RC delay and power consumption, as well as low system performance, become limiting factors.

One proposed solution to these problems is three-dimensional (3-D) integration or packaging technology. 3-D integration refers to the vertical stacking of multiple die, packaged die, wafers, or chips including ICs within a package. In recent 3-D integration technology, multiple die or wafers are electrically connected using vertical connectors or 3-D conductive structures. Vertical connectors extend through one or more of the die and are aligned when the die are stacked to provide electrical communication among the ICs in the stack. Such vertical connectors are often formed of a conductive material, such as copper. 3-D integration typically results in a reduction of the packaged IC's footprint as well as a reduction in power consumption, and a simultaneous increase in performance.

Referring to FIGS. 1 and 2, a conventional 3-D IC device will be described below. The illustrated 3-D IC device 100 includes first to fourth die 110a-110d stacked over one another. The first die 110a is the uppermost die, and the fourth die 110d is the lowermost die. The second and third die 110b, 110c are interposed between the first and fourth die 110a, 110d. In other examples, a 3-D IC device can include a greater or fewer number of die than the device of FIG. 1.

Each of the first to fourth die 110a-110d includes an IC array 112, a transceiver 114, first interconnect lines 116, second interconnect lines 118 and landing pads 130a-130d. Each of the die 110a-110c, except for the lowermost die (the fourth die 110d in the illustrated example), also includes vertical connectors 120a-120c (FIG. 2). In the context of this document, such vertical connectors may also be referred to as "3-D interconnects" or "3-D conductive structures." In an example where the die are formed of silicon, such vertical connectors may be referred to as "through-silicon vias" (TSVs).

The IC array 112 may include one or more integrated circuits, including, but not limited to, one or more memories (for example, volatile and/or non-volatile memories) and one or more processors. The first interconnect lines 116 provide data paths between the IC array 112 and the transceiver 114 on a respective one of the die 110a-110d. The second interconnect lines 118 provide data paths between the transceiver 114 and the landing pads 130a-130d of a respective one of the die 110a-110d.

The vertical connectors 120a-120c provide electrical paths between the landing pads 130a-130d of two die 110a-110d that are stacked immediately next to each other, thereby completing parts of data paths between the IC arrays 112 on the two die. In certain cases, the vertical connectors 120a-120c of two or more die 110a-110d that are stacked over one another are aligned in series, and can together provide serial data paths among the two or more die.

Referring to FIGS. 3A and 3B, a conventional scheme for data transfer between two ICs on different die via vertical connectors will be described below. The illustrated portion of a 3-D IC device 300 includes a die 310, a first re-routing logic circuit 301, a second re-routing logic circuit 302, transmission drivers 331a-331d, 341a-341d, 331r, 341r, and comparators 332a-332d, 342a-342d, 332r, 342r.

The die 310 includes first to fourth nominal vertical connectors 320a-320d and a repair vertical connector 325. The repair vertical connector 325 may also be referred to as "redundant vertical connector" in the context of this document. In other examples, a die may include a greater or fewer number of nominal and/or repair vertical connectors than the die 310 of FIG. 3A.

The first and second re-routing logic circuits 301, 302 are configured to route data signals between the two ICs on the different die. One of the two ICs may be on the die 310, and the other IC may be on a die immediately below the die 310. The transmission drivers 331a-331d, 341a-341d, 331r, 341r are configured to buffer the data signals for transfer through the vertical connectors 320a-320d, 325. The comparators 332a-332d, 342a-342d, 332r, 342r are configured to detect the levels of the data signals that have been transferred through the vertical connectors 320a-320d, 325.

When there is no defect in the nominal vertical connectors 320a-320d, the first and second re-routing logic circuits 301, 302 can route data signals between the ICs on the different die, using the nominal vertical connectors 320a-320d, as shown in FIG. 3A. Statistically, however, it is improbable that 100% of the vertical connectors are functional, following the stress of fabrication and testing.

Thus, 3-D IC devices are typically tested during fabrication to determine if there are any defective vertical connectors. For example, if any one (for example, the fourth vertical connector 320d, as shown in FIG. 3B) of the nominal vertical connectors 320a-320d is found to be defective during the fabrication/testing of the 3-D IC device, the first and second re-routing logic circuits 301, 302 are configured to replace the defective vertical connector 320d with the repair vertical connector 325. Thus, data signals are routed via the repair vertical connector 325 and the remaining non-defective nominal vertical connectors (for example, the first to third vertical connector 320a-320c, as shown in FIG. 3B).

FIG. 4 illustrates the layout of a conventional 3-D IC device 400 employing the scheme described above in connection with FIGS. 3A and 3B. The illustrated portion of the 3-D IC device 400 includes IC arrays 412a-412c on a die, and first to fourth columns 415a-415d of vertical connectors 420, 425.

Each of the first to fourth columns 415a-415d includes nominal vertical connectors 420 and a repair vertical connector 425. In the illustrated example, each of the first to fourth columns 415a-415d includes nine (9) nominal vertical connectors 420 and one (1) repair vertical connector 425. Any one of the nine nominal vertical connectors 420 in a column 415a-415d may be replaced with the repair vertical connector 425 in the column, when it is found to be defective.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

Figure 1:
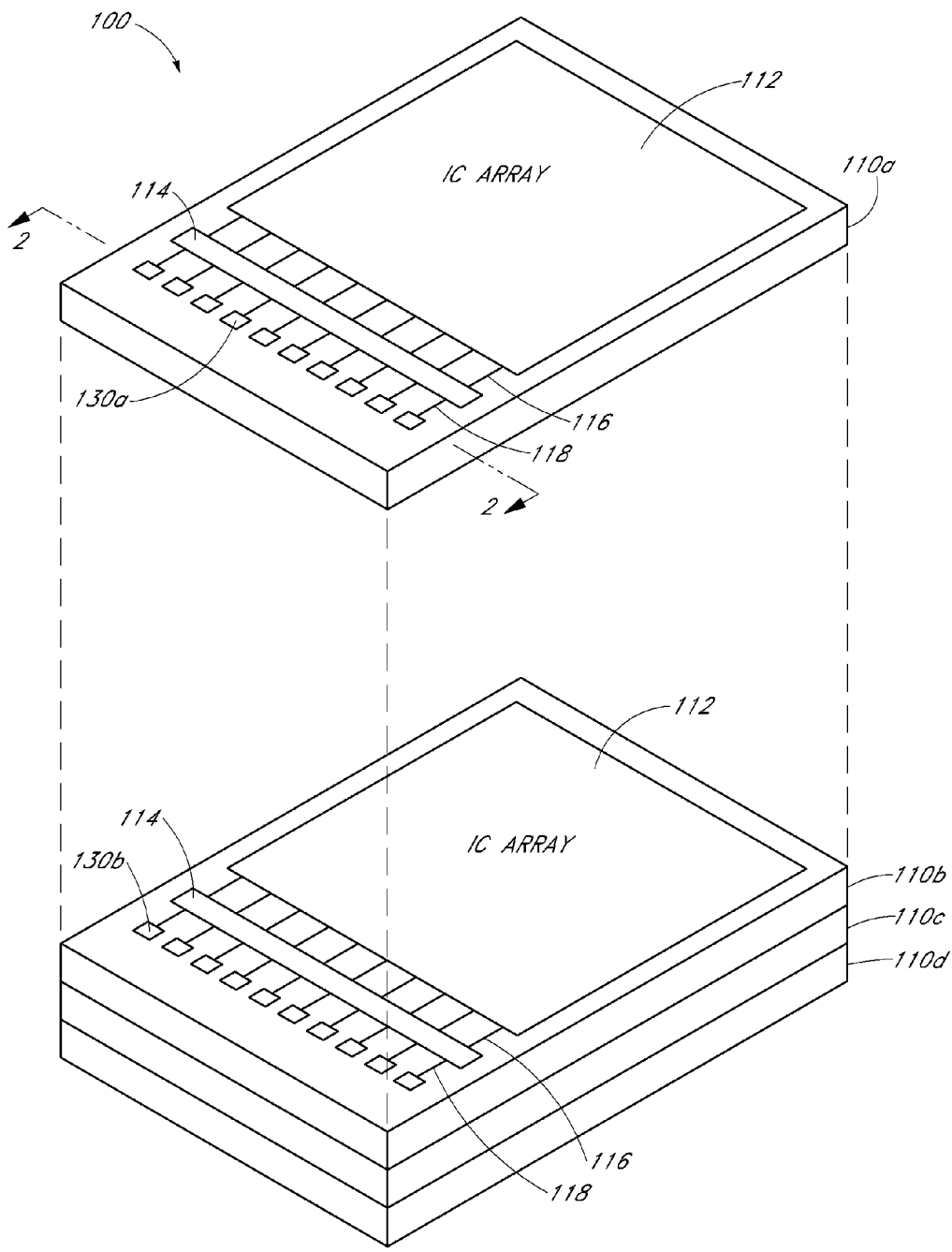
FIG. 1 is a schematic perspective view of a conventional 3-D integrated circuit device.
Figure 2:
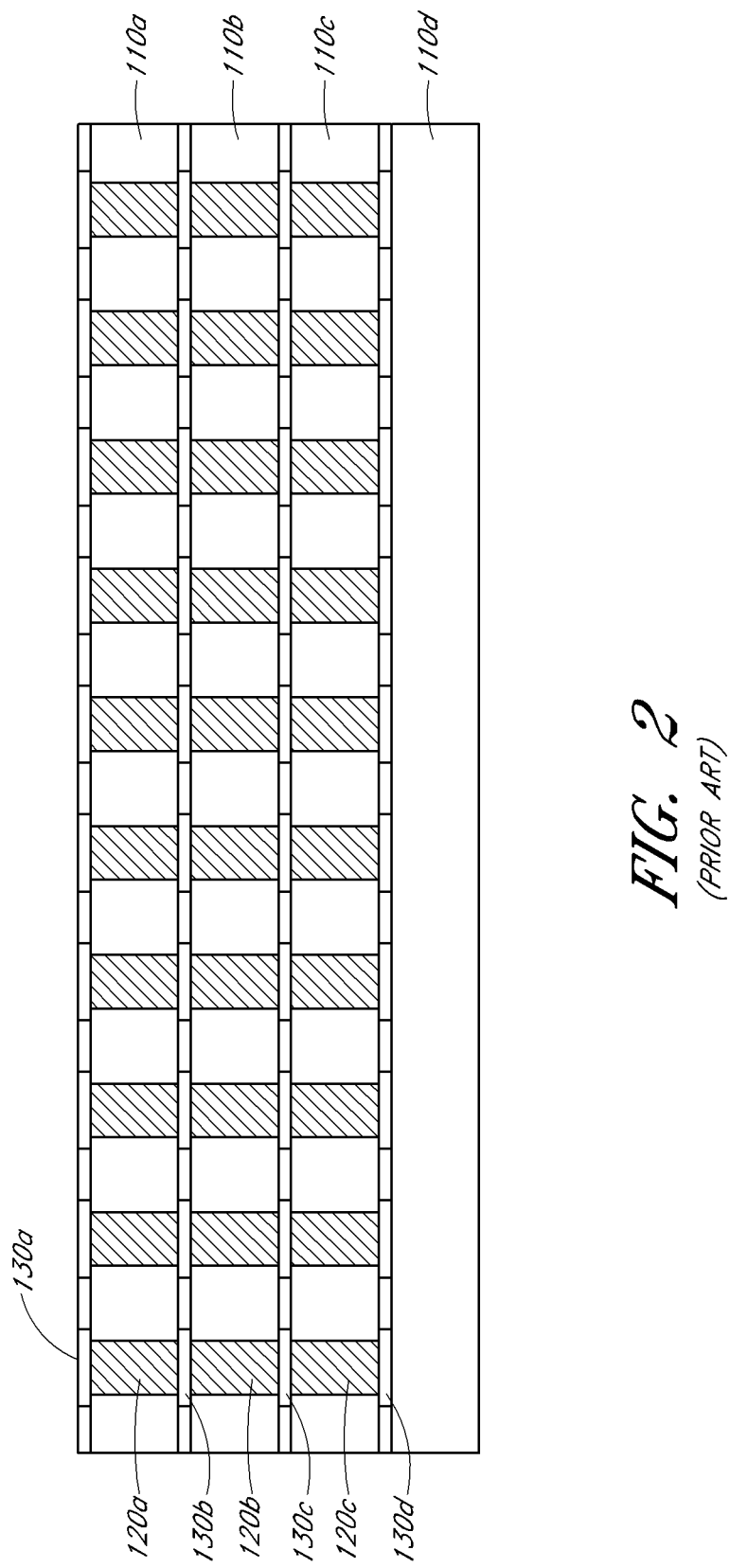
FIG. 2 is a cross-section of the device of FIG. 1, taken along the line 2-2.

In a 3-D IC device including vertical connectors for data transfer, malfunction of any of the vertical connectors may render at least some portion of the device inaccessible. In the conventional 3-D IC devices described above in connection with FIGS. 3 and 4, a first group of vertical connectors includes a number of nominal vertical connectors and a single repair vertical connector. A defective nominal vertical connector in the group may be replaced with the repair vertical connector in the same group. When two or more nominal vertical connectors in the first group are defective, one or more repair vertical connectors in other groups of vertical connectors may be used to replace the defective nominal vertical connectors in the first group.

In certain instances, however, if the number of defective nominal vertical connectors in a die exceeds the number of available repair vertical connectors in the die, at least some of the defective nominal vertical connectors cannot be repaired. In practice, however, it is difficult to predict how many repair vertical connectors are needed to avoid such problems and how repair vertical connectors may most efficiently be configured. The addition of a large number of redundant vertical connectors may consume a large die area and increase signal routing congestion.

Furthermore, the replacement of a defective vertical connector with a remotely-located repair vertical connector may complicate the re-routing of data signals by the re-routing circuits. In addition, there can be a skewed delay due to data transfer through the repair vertical connectors, which may reduce timing margins. Another disadvantage of the conventional scheme of FIGS. 3 and 4 is that it does not allow for the "on the fly" or "in the field" reconfiguration during the operation of the 3-D IC device without detection of defective vertical connectors in real time.

Therefore, there is a need for a scheme that can efficiently provide the repair of a defective vertical connector without including a large number of repair vertical connectors while reducing the complication of re-routing. There is also a need for the "on the fly" repair of defective vertical connectors during the operation of the 3-D IC device.

In one embodiment, a 3-D integrated circuit device includes two or more die stacked over one another. Each of the die may include one or more integrated circuits (ICs) formed therein. The device also includes a plurality of vertical connectors formed through at least one of the die. The vertical connectors are configured to form at least part of the data paths between two of the ICs that are on two different ones of the die.

The device further includes a first encoding/decoding circuit to encode multiple independent data digits from one of the two ICs into a single multi-level signal. As used herein, multi-level means more than two levels. The device transfers the same multi-level signal through two or more of the vertical connectors. The device also includes a second encoding/decoding circuit to decode the multi-level signal transferred through the vertical connectors into the original multiple data digits. The decoded multiple data digits are provided to the other of the two ICs.

Even if one or more, but not all, of the two or more vertical connectors (through which the same multi-level signal is transferred) are defective, the second encoding/decoding circuit can recover the original multiple data bits using the multi-level signal from non-defective ones of the two or more vertical connectors, thus repairing or bypassing the defective vertical connectors in effect without any signal rerouting.

Figure 5A:
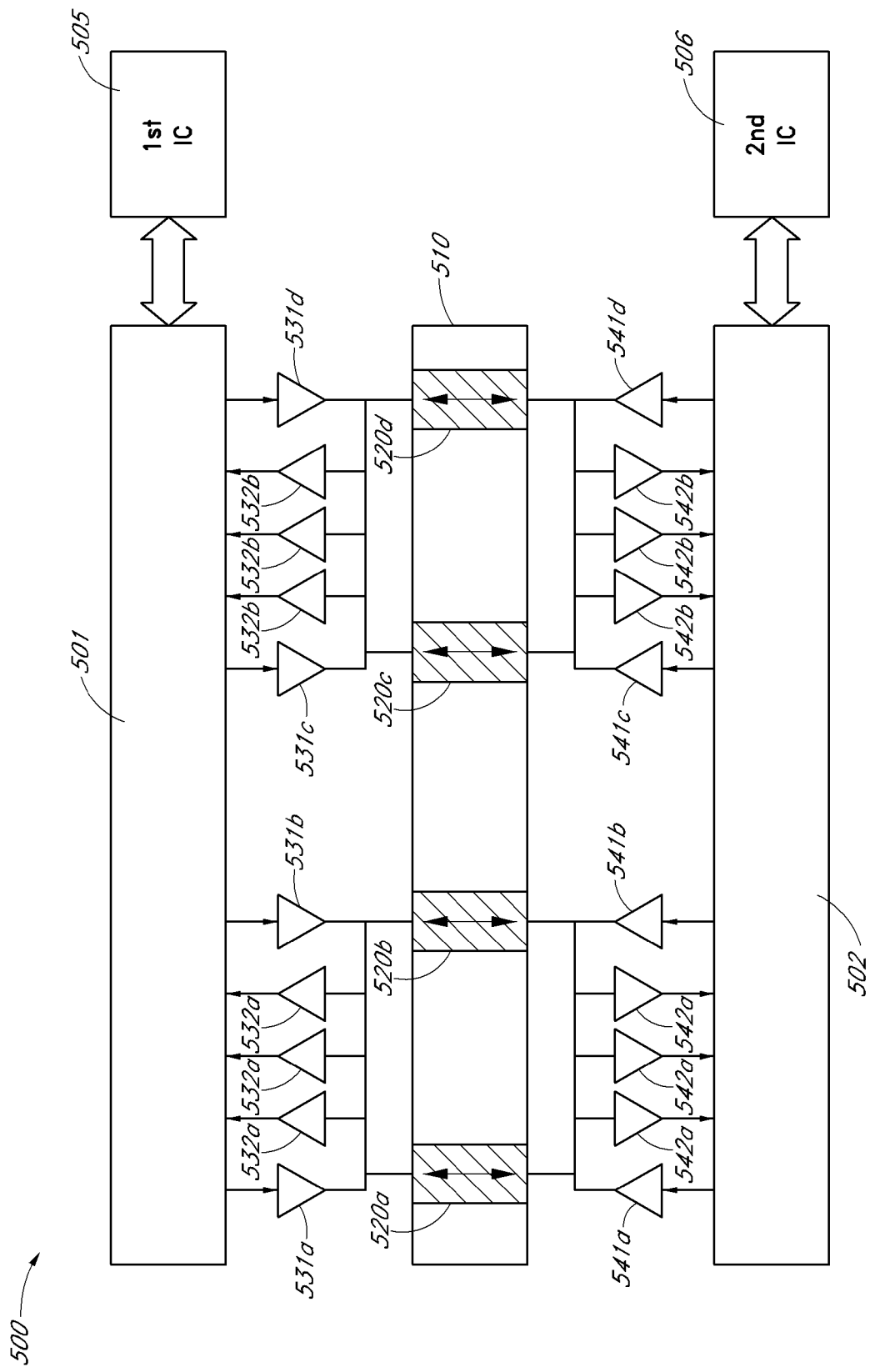
FIG. 5A is a block diagram illustrating the operation of one embodiment of a 3-D integrated circuit device that transfers data via vertical connectors when there is no defective vertical connector.
Figure 5B:
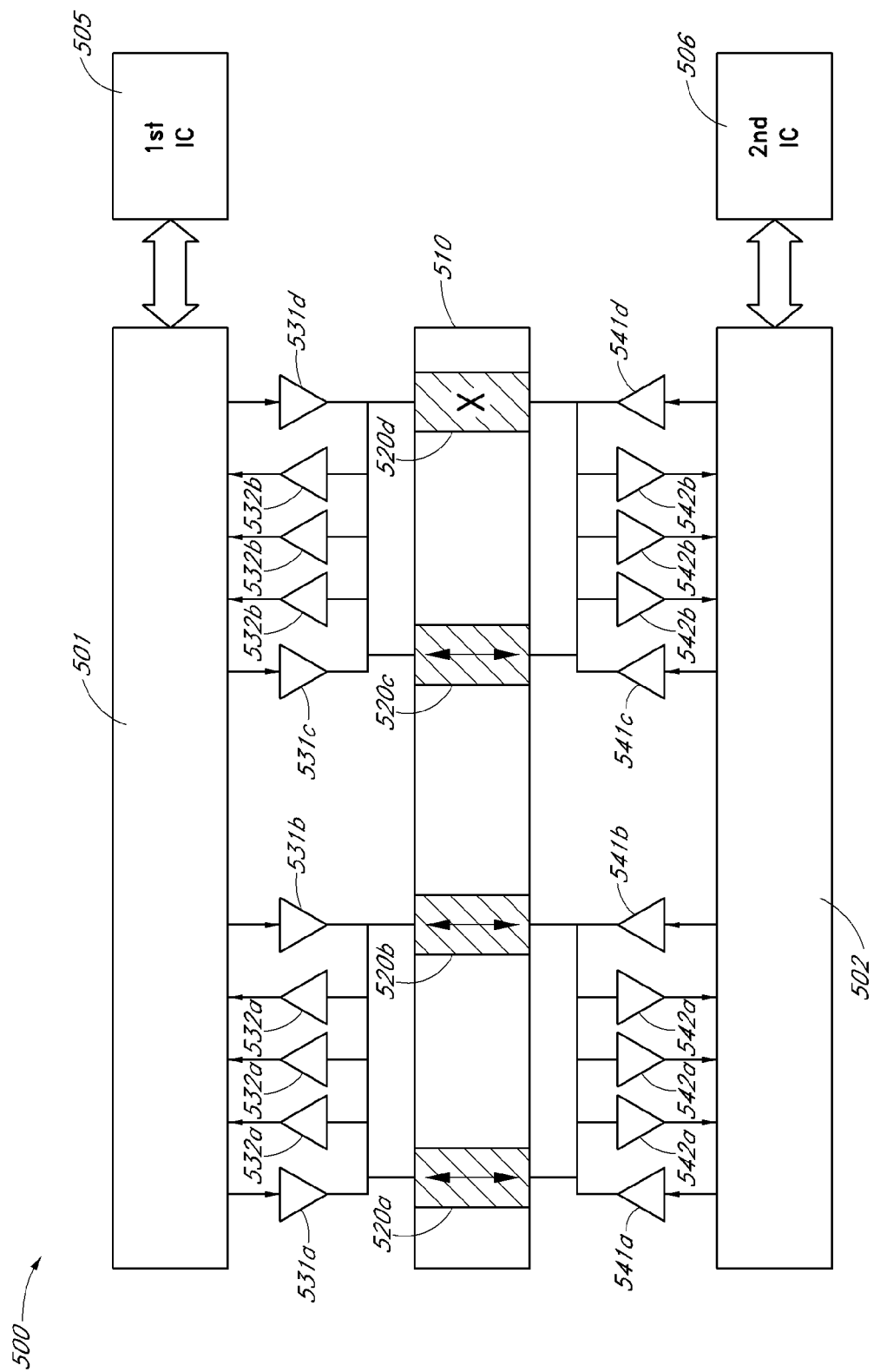
FIG. 5B is a block diagram illustrating the operation of the device of FIG. 5A when one of the vertical connectors is defective.

Referring to FIGS. 5A and 5B, a scheme for data transfer between two ICs on different die via vertical connectors in a 3-D IC device according to one embodiment will be described below. The illustrated portion of the 3-D IC device 500 includes a die 510, a first IC 505, a second IC 506, a first encoding/decoding circuit 501, a second encoding/decoding circuit 502, transmission drivers 531a-531d, 541a-541d, and first to fourth sets of comparators 532a, 532b, 542a, 542d.

The illustrated die 510 includes first to fourth nominal vertical connectors 520a-520d, and does not need to include a repair vertical connector. In some embodiments, the die 510 may include at least one repair vertical connector. In other embodiments, a die may include more or fewer nominal vertical connectors than the illustrated die 510.

The first IC 505 may be located on the die 510, and the second IC 506 may be located on a second die (not shown) immediately below the die 510. In some embodiments, the first IC 505 may be located on a third die (not shown) above the die 510. In other embodiments, the second IC 506 may be located on a fourth die (not shown) below the second die.

The first encoding/decoding circuits 501 may be located on the die 510 or on the third die (not shown) above the die 510. When transferring data from the first IC 505 to the second IC 506, the first encoding/decoding circuit 501 may encode data digits from the first IC 505 into multi-level signals. When transferring data from the second IC 506 to the first IC 505, the first encoding/decoding circuit 501 may decode multi-level signals from the vertical connectors 520a-520d into the original data digits, and provide them to the first IC 505.

The second encoding/decoding circuits 502 may be located on the second die (not shown) immediately underlying the die 510 or on the fourth die (not shown) below the second die. When transferring data from the second IC 506 to the first IC 505, the second encoding/decoding circuit 502 may encode data digits from the second IC 506 into multi-level signals. When transferring data from the first IC 505 to the second IC 506, the second encoding/decoding circuit 502 may decode multi-level signals from the vertical connectors 520a-520d into the original data digits, and provide them to the second IC 506.

The transmission drivers 531a-531d, 541a-541d serve to buffer data signals for transfer through the vertical connectors 520a-520d. A skilled artisan will appreciate that any suitable types of drivers can be adapted for use as the transmission drivers 531a-531d, 541a-541d.

The first to fourth sets of comparators 532a, 532b, 542a, 542b serve to detect the levels of the data signals that have been transferred through the vertical connectors 520a-520d. The number of comparators in each set can vary, depending on how many levels the multi-level signals have.

Figure 6A:
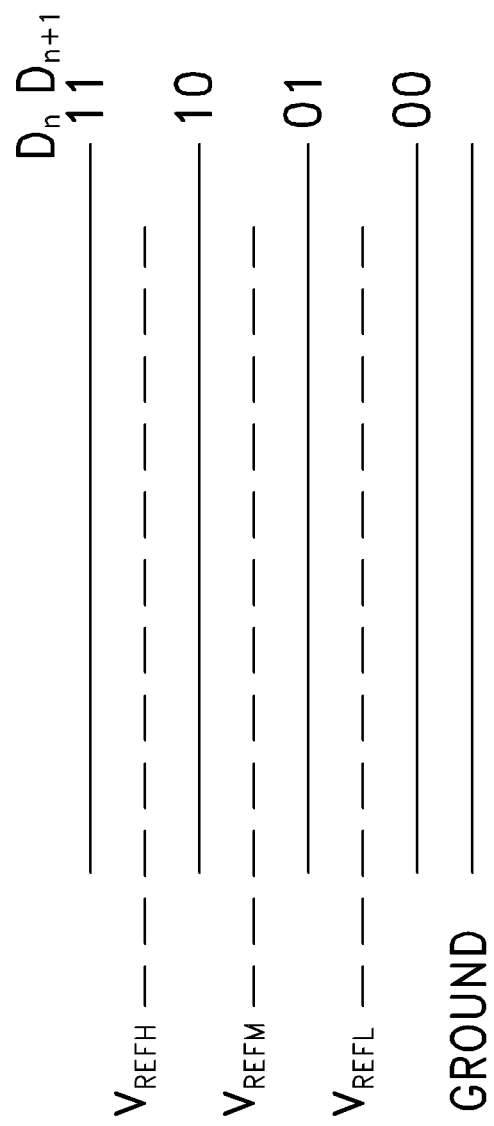
FIG. 6A is a graph illustrating a multi-level signaling scheme for use in the device of FIGS. 5A and 5B according to one embodiment.

In the illustrated embodiment, when, for example, transferring data from the first IC 505 to the second IC 506, the first encoding/decoding circuit 501 (which is on the transmitting side) encodes every two parallel data bits into a four (4) level signal, as shown in FIG. 6A. In FIG. 6A, the four signal levels represent two independent data bits $b_0 b_1$. The highest voltage level over a high reference voltage $V_{REFH}$ may represent the bits "11." The second highest voltage level between the high reference voltage $V_{REFH}$ and a middle reference voltage $V_{REFM}$ (which is lower than $V_{REFH}$) may represent the bits "10." The third highest voltage level between the middle reference voltage and a low reference voltage $V_{REFL}$ (which is lower than $V_{REFM}$) may represent the bits "01." The lowest voltage level lower than $V_{REFL}$ may represent the bits "00." Such an encoding scheme may be referred to as 4-level pulse amplitude modulation (or 4-PAM). Other encoding schemes can alternatively be used and will be readily determined by one of ordinary skill in the art.

Figure 6B:
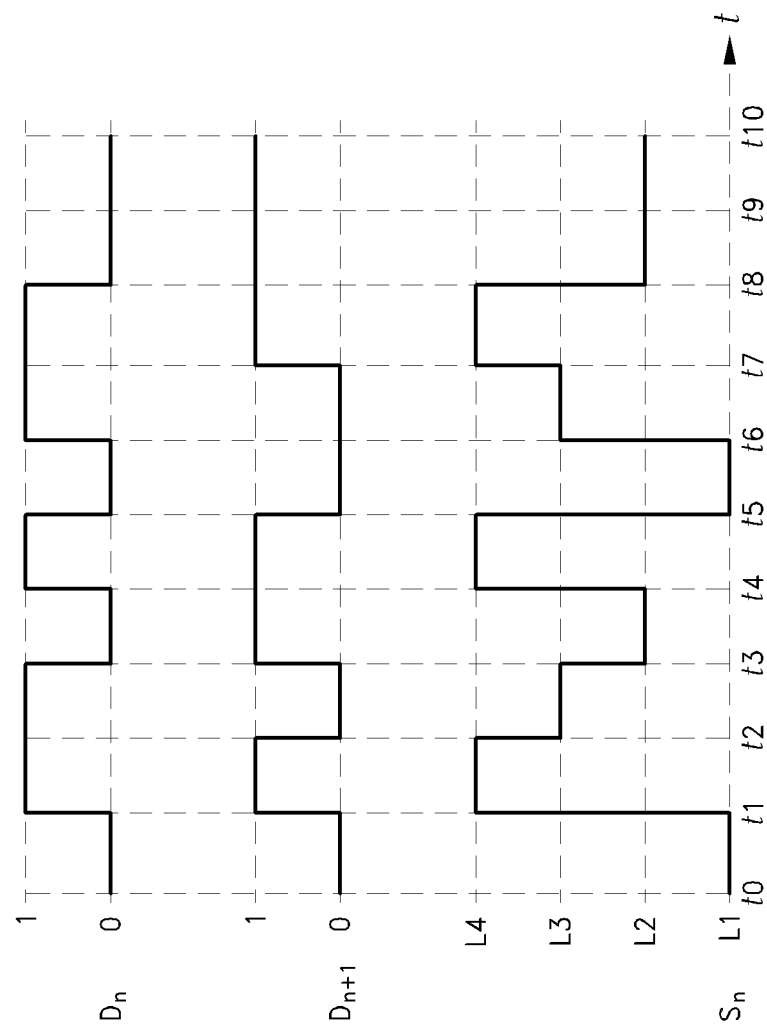
FIG. 6B is a timing diagram illustrating a multi-level signaling scheme for use in the device of FIGS. 5A and 5B according to one embodiment.

FIG. 6B illustrates an example of how two data bits are converted into a digit of a single four-level signal. For example, a first data signal $D_n$ and a second data signal $D_{n+1}$ have bits "0" and "0," respectively, between t0 and t1. These two bits are converted into a 4-level signal $S_n$ having the lowest signal level L1. The first data signal $D_n$ and the second data signal $D_{n+1}$ have bits "1" and "1," respectively, between t1 and t2. These two bits change the 4-level signal $S_n$ to have the highest signal level L4. The first data signal $D_n$ and the second data signal $D_{n+1}$ have bits "1" and "0," respectively, between t2 and t3. These two bits change the 4-level signal $S_n$ to have the second highest signal level L3. The first data signal $D_n$ and the second data signal $D_{n+1}$ have bits "0" and "1," respectively, between t3 and t4. These two bits change the 4-level signal $S_n$ to have the second lowest signal level L2. The 4-level signal is transmitted at every clock edge by transferring an appropriate one of the four voltage levels.

Referring back to FIG. 5A, the first encoding/decoding circuit 501 encodes every two data bits into a digit of a single 4-level signal. Any suitable encoding circuit may be used for such encoding. A difference between the 4-PAM encoding described here and 4-PAM encoding often used in communication systems is that typically the two data bits which are encoded into a single multi-level symbol are located sequentially (serially) in the data stream, whereas in the proposed embodiment the two encoded data bits would be concurrent (parallel), or located within the same cycle of a neighboring data stream. The 4-level signal is provided to a pair of transmission drivers, for example, two transmission drivers 531a and 531b, or two transmission drivers 531c and 531d on the transmitting side in the illustrated embodiment. The pair of transmission drivers provide the same 4-level signal to a pair of vertical connectors, for example, first and second vertical connectors 520a, 520b, or the third and fourth vertical connectors 520c, 520d in the illustrated embodiment.

The 4-level signal propagates through the pair of vertical connectors, and is detected by the third or fourth set 542a, 542b of comparators on the receiving side. The third or fourth set 542a, 542b of comparators combine with the second encoding/decoding circuit 502 to capture and decode or translate the level of the 4-level signal into the appropriate original data bits on the receiving side (e.g., the second IC 506).

In the illustrated embodiments where 4-PAM is used for data transfer, every data bits are encoded into a 4-level signal for data transfer through a pair of vertical connectors. In other embodiments, other multi-level pulse amplitude modulation (M-PAM) can be used for data transfer via the vertical connectors. The number of signal levels is indicated by a number before the acronym "PAM." For example, a PAM signaling scheme using eight signal levels is represented by 8-PAM.

In such other embodiments, the number of comparators for detecting such a multi-level signal and the number of vertical connectors through which the same multi-level signal is transferred can vary, depending on how many signal levels the multi-level signal has. In one embodiment where an 8-PAM signaling scheme is used for data transfer, the same 8-PAM signal may be transferred through three different vertical connectors. In such an embodiment, 7 comparators may be used for leveling the decoding of the 8-PAM signal. A skilled artisan will appreciate that other suitable signaling schemes can be used for such data transfer, including Quadrature-Phase-Shift-Keying (Q-PSK), in which the two original data bits are encoded into one of four symbols comprising a single signal level and a corresponding signal phase shift. Such an embodiment would simply require the appropriate encoding/decoding, and transmitting/receiving circuits, all of which are well known to those skilled in the art of digital communication. For consistency, the remainder of the Detailed Description of Embodiments will continue to focus on multi-level signal representations, though it is understood that at a more general level, the invention would function with any multi-bit signal representation, as just described. It is also pointed out here that when signals are encoded in this manner (multiple bits into a single cycle), the resulting multi-bit cycle is commonly referred to as a symbol or multi-bit symbol. For generality, this terminology will be employed in the accompanying claims.

When there is no defect in the vertical connectors 520a-520d, data transfer via the vertical connectors 520a-520d is carried out as described above in connection with FIG. 5A. Even if any one (for example, the fourth vertical connector 520d, as shown in FIG. 5B) of the vertical connectors 520a-520d is found to be defective during the fabrication of the 3-D integrated circuit device 500 or if it malfunctions during the normal operation, data transfer can be carried out without error. In such an instance, typically, no signal is transferred through the defective or malfunctioning vertical connector. However, the other vertical connector(s) paired (or grouped) with the defective vertical connector provide(s) a data path for a multi-level signal. The encoding/decoding circuit on the receiving side can decode the multi-level signal back into the original data bits, in effect repairing or bypassing the defective vertical connector.

Figure 7:
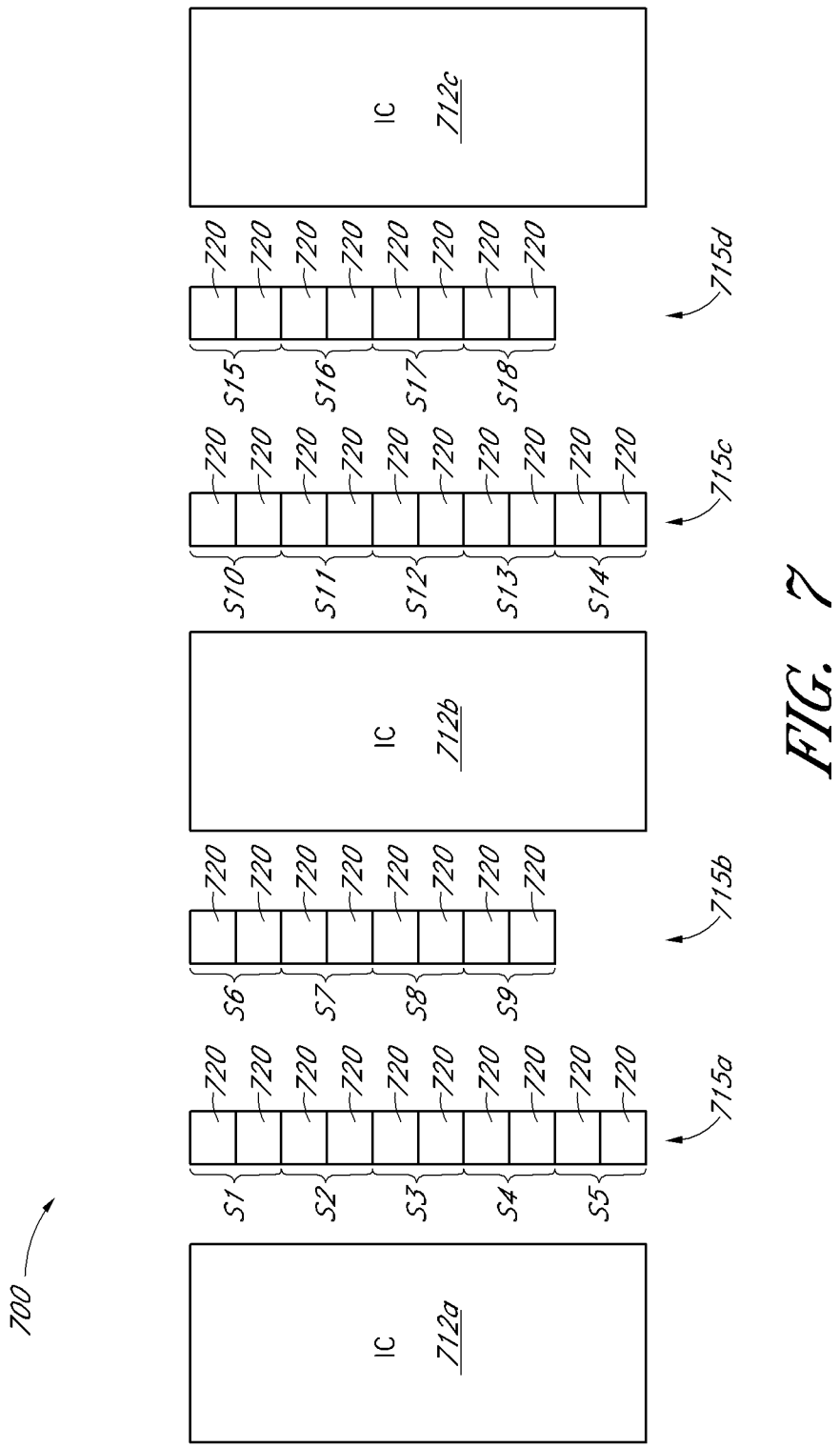
FIG. 7 is a schematic top plan view illustrating one embodiment of the layout of a die in a 3-D integrated circuit device.

Referring to FIG. 7, one embodiment of the layout of a 3-D IC device 700 will be described below. The 3-D IC device 700 employs the scheme described above in connection with FIGS. 5A and 5B. The illustrated portion of the 3-D IC device 700 includes IC arrays 712a-712c on a die, and first to fourth columns 715a-715d of vertical connectors 720.

In the illustrated embodiment, each of the first to fourth columns 715a-715d may include a plurality of nominal vertical connectors 720, but no designated repair vertical connector 720. Each of the first and third columns 715a, 715c includes ten (10) vertical connectors 720. Each of the second and fourth columns 715b, 715d includes eight (8) vertical connectors 720. A skilled artisan will, however, appreciate that the number of vertical connectors in the columns 715a-715d can vary widely, depending on the design of the IC device 700.

In the illustrated embodiment, 4-level signals are used for data transfer through the vertical connectors. In the illustrated embodiment, in each of the columns 715a-715d, every two adjacent vertical connectors 720 are paired with each other. Each pair S1-S18 of vertical connectors provides two separate data paths for the same 4-level signal. Thus, when one of the paired vertical connectors S1-S18 is defective, the other non-defective vertical connector can still provide a data path for the 4-level signal, thereby allowing the encoding/decoding circuit on the receiving side to recover the original two data bits.

In alternative embodiments, any two of the vertical connectors (not limited to adjacent two vertical connectors) may be grouped together for providing data paths for the same 4-level signal. In alternative embodiments, other multi-bit signaling schemes may be used for data transfer. For example, rather than representing the parallel data bits with a multi-level symbol, multiple parallel data bits may be represented with symbols comprising both signal level and phase, as discussed previously. In such embodiments, a different number of vertical connectors may be grouped together for providing data paths for the same multi-bit signal. Thus, rather than representing two parallel data bits with four signal levels (4-PAM) or four signal phase shifts (Q-PSK), three parallel data bits to be transmitted across three connectors may be represented with eight signal levels (8-PAM) or two signal levels and four phase shifts (8-PSK).

In certain embodiments, a 3-D integrated circuit device may use the scheme described above in connection with FIGS. 5A, 5B, 6A, 6B, and 7, and yet include one or more repair vertical connectors. Such repair vertical connectors may be used when all of a pair or a group of vertical connectors for transferring the same multi-level signal are defective.

The schemes in the embodiments described above in connection with FIGS. 5A, 5B, 6A, 6B, and 7 use zero or fewer redundant repair vertical connectors because a nominal vertical connector can effectively provide the repair or bypass of a defective nominal vertical connector paired or grouped with it. Thus, area on a die for such repair vertical connectors can be saved or reduced.

In certain embodiments, such spaces can be used for any other components of the IC device. In one embodiment, vertical connectors for power transfer and FatCap (alternatively, referred to as "CFAT") may be provided on the die in place of such repair vertical connectors. The term "FatCap" refers to decoupling capacitance placed between power supplies to dampen noise. FatCaps typically occupy a relatively large space.

Figure 3A:
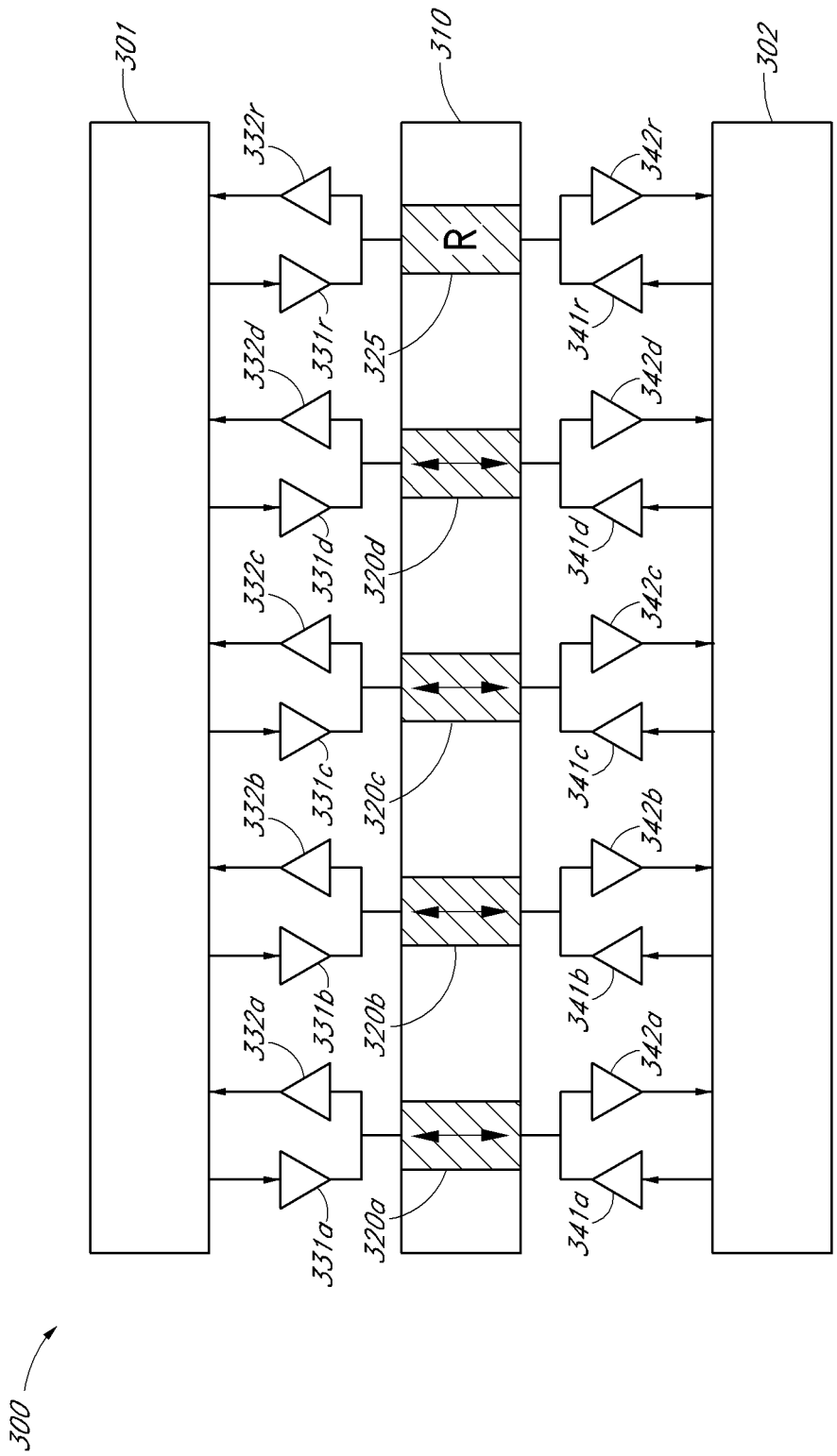
FIG. 3A is a block diagram illustrating the operation of a conventional 3-D integrated circuit device that transfers data via vertical connectors when there is no defective vertical connector.
Figure 3B:
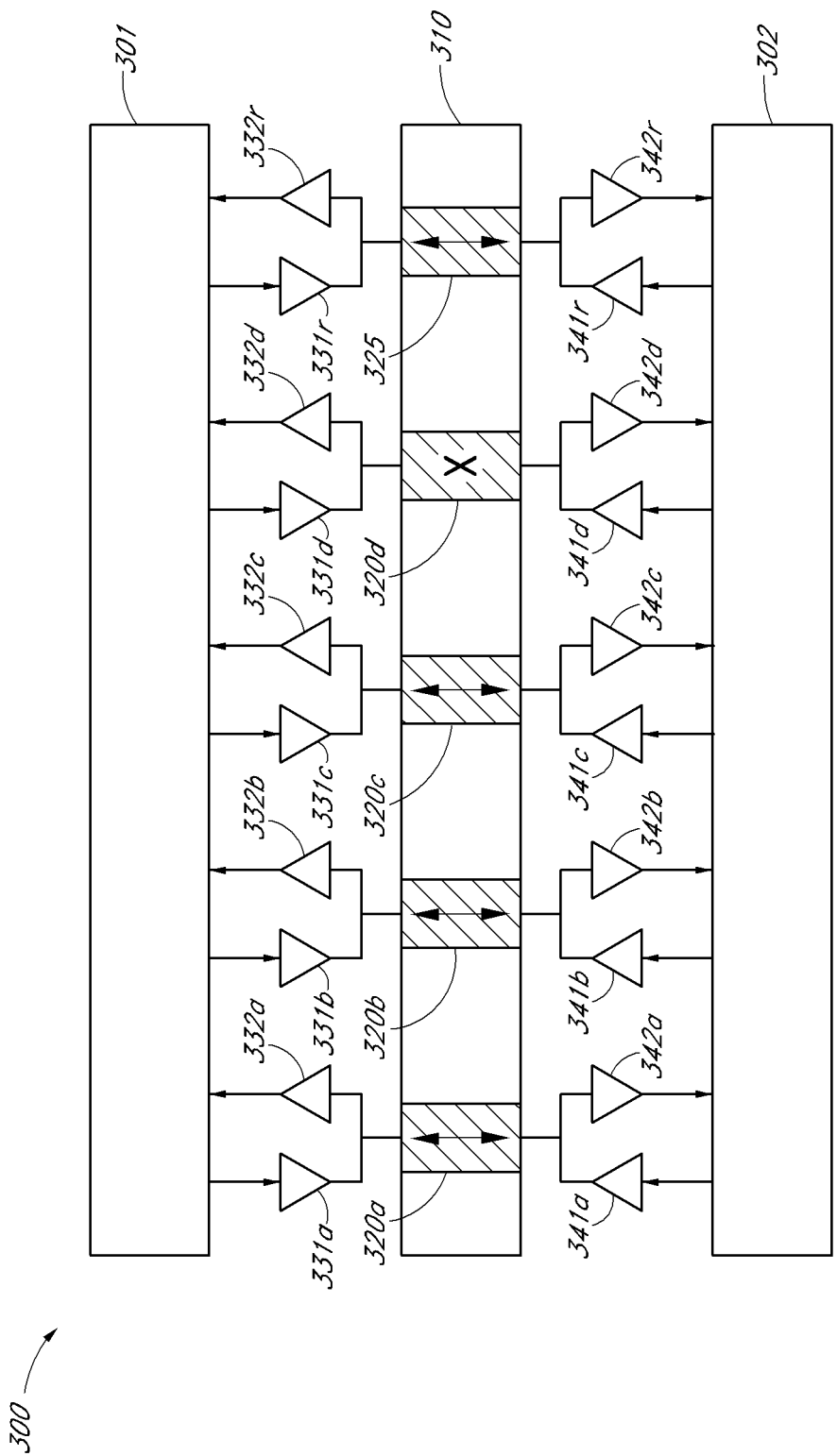
FIG. 3B is a block diagram illustrating the operation of the device of FIG. 3A when one of the nominal vertical connectors is repaired with a repair vertical connector.
Figure 4:
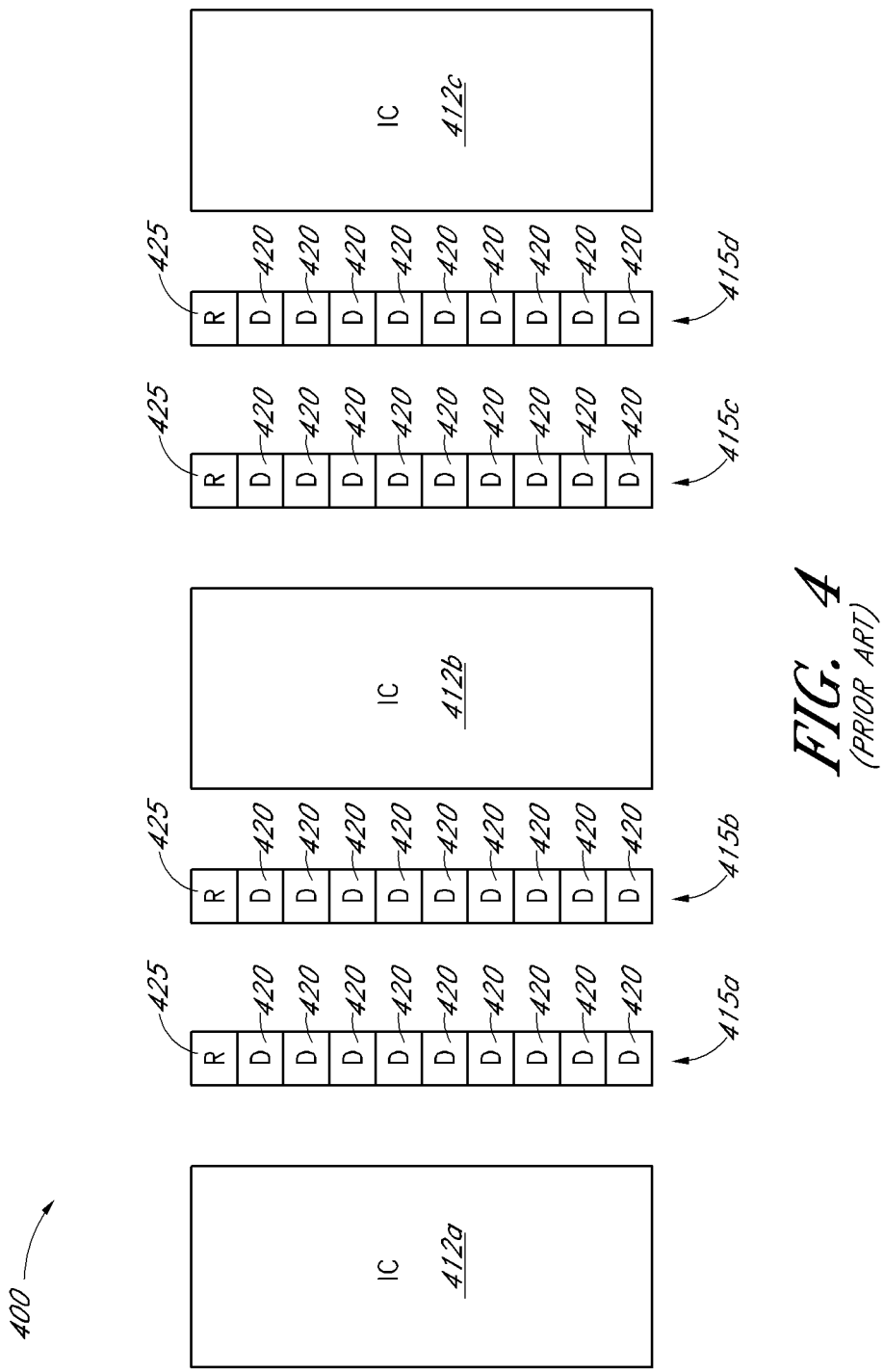
FIG. 4 is a schematic top plan view illustrating the layout of a die in a conventional 3-D integrated circuit device.

Because each pair of vertical connectors has effectively one repair vertical connector in the schemes described above, the schemes provide more repairability with no or less extra designated repair vertical connectors than the conventional scheme of FIGS. 3A and 3B. In addition, the schemes can avoid complex re-routing circuitry as described above in connection with FIGS. 3A and 3B. This minimizes delay skews due to re-routing. Furthermore, the schemes allow "field" repair, that is, any defective vertical connectors grouped with functional connectors are effectively bypassed and therefore require no on the fly repair during the operation of the IC device.

3-D IC devices employing the above described schemes can be implemented into various electronic devices. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

In one embodiment, an apparatus includes: a first die; a second die encapsulated within a same package as the first die; a first data path for a multi-bit symbol configured to carry data between the first and second die; and a second data path configured to carry the same multi-bit symbol for redundancy.

In another embodiment, an integrated circuit device includes two or more die stacked over one another. Each of the die includes an IC formed therein. The device also includes a plurality of vertical connectors on at least one of the die. The vertical connectors are configured to couple data paths between at least two of the ICs of different die. The device further includes an encoding/decoding circuit configured to transfer an identical multi-bit symbol through a set of two or more of the vertical connectors, wherein the identical multi-bit symbols have more than two voltage levels.

In yet another embodiment, a method of transferring data in a 3-D integrated circuit device includes: encoding two or more data bits into a multi-bit symbol representing the two or more data bits; transferring, for redundancy of communication, the same multi-bit symbol through two or more vertical connectors formed through a die of the 3-D integrated circuit device; and decoding the digit of the transferred multi-bit symbol into the two or more data bits.

In yet another embodiment, a method of transferring data between integrated circuit devices, includes: encoding two or more data bits into a multi-bit symbol representing the two or more data bits; transferring, for redundancy of communication, the same multi-bit symbol across two or more IC connectors; and decoding the transferred multi-bit symbol into the two or more data bits.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

I claim:

1. An integrated circuit device comprising:
   two or more die stacked over one another, each of the two or more die including an integrated circuit (IC) formed therein;
   a plurality of vertical connectors on at least one of the two or more die, the plurality of vertical connectors being configured to couple data paths between at least two of the ICs of different die of the two or more die; and
   an encoding/decoding circuit configured to transfer a multi-bit symbol redundantly through a set of two or more of the vertical connectors such that the same multi-bit symbol is transferred between the at least two ICs of different die though each of the vertical connectors of the set.

2. The device of claim 1, wherein the encoding/decoding circuit is configured to encode multiple data bits from one of the at least two ICs into the multi-bit symbol, and provide the multi-bit symbol to the set of two or more of the vertical connectors.

3. The device of claim 2, wherein the encoding/decoding circuit is configured to encode two data bits into a four-level signal having four signal levels.

4. The device of claim 3, wherein the encoding/decoding circuit is configured to encode data using pulse amplitude modulation (PAM).

5. The device of claim 1, wherein the encoding/decoding circuit is further configured to decode the multi-bit symbol from at least one of the set of two or more of the vertical connectors into multiple data bits.

6. The device of claim 1, wherein the encoding/decoding circuit is further configured to transfer another substantially identical multi-bit symbol through another set of two or more of the vertical connectors.

7. The device of claim 1, wherein at least one of the two or more die is formed of silicon, and wherein the plurality of vertical connectors comprises a through-silicon via.

8. The device of claim 1, wherein at least one of the two or more die comprises a set of two or more comparators, the set of two or more comparators configured to detect a signal level of the multi-bit symbol received by way of at least one of the plurality of vertical connectors.

9. The device of claim 1, wherein the set of two or more vertical connectors comprises two adjacent vertical connectors.

10. The device of claim 1, wherein any two of the plurality of vertical connectors are configured to be part of the set of two or more vertical connectors.

11. The device of claim 1, further comprising a package encapsulating the two or more die.

12. The device of claim 1, wherein the multi-bit symbol has more than two signal levels.

13. The device of claim 1, wherein the multi-bit symbol has more than two relative phase shifts.

14. The device of claim 1, wherein multi-bit symbol comprises an 8-PAM signal, and wherein the encoding/decoding circuit is configured to transfer the multi-bit symbol redundantly by way of three of the plurality of vertical connectors.

15. An integrated circuit device comprising:
   two or more die stacked over one another, each of the two or more die including an integrated circuit (IC) formed therein;
   a plurality of vertical connectors on at least one of the two or more die, the plurality of vertical connectors being configured to couple data paths between at least two of the ICs of different die of the two or more die;
   a first encoding/decoding circuit configured to transfer a multi-bit symbol redundantly through a set of two or more of the vertical connectors; and
   a second encoding/decoding circuit configured to transfer a second multi-bit symbol redundantly through the set of two or more of the vertical connectors, and wherein the second encoding/decoding circuit and the first encoding/decoding circuit are located on separate die of the two or more die stacked over one another.

16. The device of claim 15, wherein the multi-bit symbol has more than two signal levels.

17. The device of claim 16, wherein the encoding/decoding circuit is configured to encode data using pulse amplitude modulation (PAM).

18. The device of claim 15, wherein the multi-bit symbol has more than two relative phase shifts.

19. The device of claim 15, wherein at least one of the two or more die is formed of silicon, and wherein the plurality of vertical connectors comprises a through-silicon via.

20. The device of claim 19, wherein encoding/decoding circuit is configured to encode two data bits into a multi-bit symbol having four signal levels.

* * * * *

UNITED STATES PATENT AND TRADEMARK OFFICE
CERTIFICATE OF CORRECTION

Page 1 of 1

PATENT NO. : 8,792,247 B2
APPLICATION NO. : 13/588728
DATED : July 29, 2014
INVENTOR(S) : Timothy M. Hollis It is certified that error appears in the above-identified patent and that said Letters Patent is hereby corrected as shown below:

In the Claims

Column 9, line 18, in claim 1, delete "though" and insert -- through --, therefor.

Signed and Sealed this
Thirtieth Day of September, 2014

Michelle K. Lee
*Deputy Director of the United States Patent and Trademark Office*